US006476734B2

United States Patent
Jeong et al.

(12)

(10) Patent No.: US 6,476,734 B2
(45) Date of Patent: Nov. 5, 2002

(54) METHOD AND APPARATUS FOR PRIORITIZING INFORMATION PROTECTION IN HIGH ORDER MODULATION SYMBOL MAPPING

(75) Inventors: Gibong Jeong; Edwin Park, both of San Diego, CA (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/948,893

(22) Filed: Sep. 7, 2001

(65) Prior Publication Data

US 2002/0126763 A1 Sep. 12, 2002

Related U.S. Application Data

(60) Provisional application No. 60/232,357, filed on Sep. 14, 2000.

(51) Int. Cl.[7] .................................................. H03M 7/40
(52) U.S. Cl. ........................................... 341/50; 341/81
(58) Field of Search ............................. 341/67, 81, 82, 341/65

(56) References Cited

U.S. PATENT DOCUMENTS 6,211,801 B1 * 4/2001 Girod .......................... 341/81

OTHER PUBLICATIONS

Robertson, Patrick, et al., "Extensions of Turbo Trellis Coded Modulation to High Bandwidth Efficiencies," IEEE 1997, pp. 1251–1255.
Le Goff, Stephane, et al., "Turbo–Codes and High Spectral Efficiency Modulation," IEEE 1994, pp. 645–649.

* cited by examiner

*Primary Examiner*—Brian Young
(74) *Attorney, Agent, or Firm*—Pedro P. Hernandez; W. James Brady III; Frederick J. Telecky, Jr.

(57) ABSTRACT

A method for prioritizing protection in the symbol mapping of selected information includes the steps of supplying information bits and overhead bits. Interleaving the information bits and overhead bits to supply a plurality of interleaved data blocks. And selectively mapping the plurality of interleaved data blocks into a modulation symbol.

10 Claims, 5 Drawing Sheets

FIG. 6A

| CODE RATE | 1/4 | 1/3 | 1/2 | 3/4 |
|---|---|---|---|---|
| $b_0 b_1$ (INT 1) | S=3, P=1 | S=2 | S=2 | S=4 |
| $b_2 b_3$ (INT 2) | P=4 | P=2 | S=1, P=1 | S=4 |
| $b_4 b_5$ (INT 3) | P=4 | P=2 | P=2 | S=1, P=3 |

FIG. 6B

| CODE RATE | 1/4 | 1/3 | 1/2 | 3/4 |
|---|---|---|---|---|
| $b_0 b_1 b_2$ (INT 1) | S=3, P=3 | S=2, P=1 | S=3 | S=6 |
| $b_3 b_4 b_5$ (INT 2) | P=6 | P=3 | P=3 | S=3, P=3 |

FIG. 6C

| CODE RATE | 1/4 | 1/3 | 1/2 | 3/4 |
|---|---|---|---|---|
| $b_0 b_1$ (INT 1) | S=1, P=1 | S=4, P=2 | S=2 | S=4 |
| $b_2 b_3$ (INT 2) | P=2 | P=6 | P=2 | S=2, P=2 |

METHOD AND APPARATUS FOR PRIORITIZING INFORMATION PROTECTION IN HIGH ORDER MODULATION SYMBOL MAPPING

This application claims priority under 35 USC § 119(e)(1) of provisional application Serial No. 60/232,357, filed Sep. 14, 2000.

FIELD OF THE INVENTION

The present invention relates generally to wireless communication and, more particularly, to a system and method for selectively protecting encoded information bits in M-ary quadrature amplitude modulation (QAM) transmissions.

BACKGROUND

As a function in the modulation and transmission process, the output of turbo encoder consists of systematic bits and punctured parity bits as shown in FIG. 1. A different code rate is realized by puncturing the parity bits at a certain rate.

In the prior art [1], and as shown in FIG. 2, the output of a turbo, or any other suitable encoder is interleaved without any consideration of importance of each code bit, or without consideration of the protection level afforded in the modulation of the encoded bits. In another prior art reference [2], the punctured parity bits are mapped to the most well-protected modulation bits without any justification.

In a third prior art reference [3], a turbo trellis modulation scheme is employed by jointly designing high order modulation and turbo code. FIG. 3 shows the turbo trellis modulation scheme where the modulation symbol boundary in time is kept by interleaving at the modulation symbol level rather than interleaving, and scattering in time the code bits. Here the systematic bits are mapped to the most well-protected modulation bits. However, this turbo trellis modulation scheme is not applicable to conventional wireless communication systems which require an interleaver between the channel encoder and the modulation symbol mapper. Since a fading channel often causes burst errors, wireless communications systems use a code bit interleaver to protect against burst errors which cause the decoder to lose both systematic and parity code bits for the same information bit during a fading period. Losing both systematic and parity code bits for a single information bit is worse for turbo decoder performance than losing a systematic bit of one information bit and a parity bit of another information bit. So, the output of the channel encoder should be interleaved before the encoder output is mapped to modulation symbols.

Thus, although it is well known that the mapping of information into modulation symbols provides different levels of noise immunity or protection, this principle has yet to be meaningfully applied to conventional wireless communication systems.

LITERATURE REFERENCES

[1] TIA 1XTREME Ad hoc group, IS-2000 1XTREME Delta Specification, V2.0d
[2] S. Le Goff, A. Glavieux and C. Berrou, "Turbo-codes and high spectral efficiency modulation," IEEE ICC 94 Proceedings, pp. 645–649, 1994.
[3] P. Robertson and T. Wortz, "Extensions of turbo trellis coded modulation to high bandwidth efficiencies," IEEE ICC 97 Proceedings, pp. 1251–1255, 1997

ADVANTAGES OF THE INVENTION OVER THE PRIOR ART

The invention achieves better channel decoder performance than the prior art by providing a greater level of protection to the more important encoded bits, such as the systematic bits, with little additional hardware.

PURPOSE OF THE INVENTION

Modern communication systems provide higher rates of data transmission through the use of multiple level modulation such as M-ary quadrature amplitude modulation (QAM). Each bit in the QAM constellation is protected against channel impairment at a different level. On the other hand, each code bit of channel encoder output has different importance level in terms of decoding. So, a method and apparatus are described herein for efficiently mapping important code bits to well-protected input bits for modulation symbol mapper, and for a corresponding receiving method and apparatus. The present invention takes advantage of the inherent structure of such a priority conversion to provide improved decoder performance and less hardware complexity.

In most wireless communication systems the output of the channel encoder is typically interleaved before the encoder output is mapped to modulation symbols, since in wireless communication systems a fading channel often causes burst errors. The present invention method and apparatus provides a means of interleaving, while matching important code bits to well-protected modulation bits.

BRIEF DESCRIPTION OF THE DRAWINGS

The features of the present invention, which are believed to be novel, are set forth with particularity in the appended claims. The invention may best be understood by reference to the following description, taken in conjunction with the accompanying drawings, in the several figures of which like reference numerals identify like elements, and in which:

FIGS. 6A–6C shows distribution ratios for different modulation schemes in accordance with the invention.

DESCRIPTION OF THE INVENTION

Figure 1:
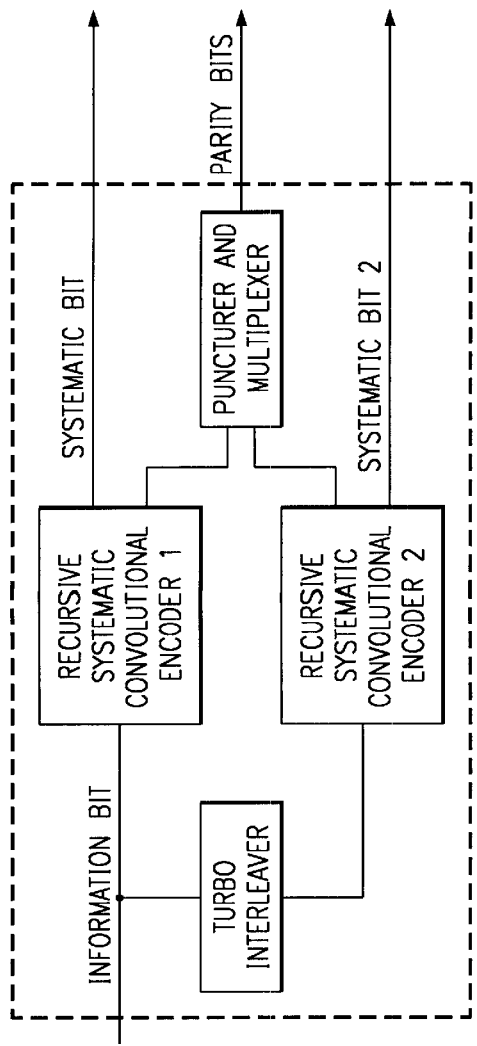
FIG. 1 shows a block diagram of a turbo encoder.
Figure 2:
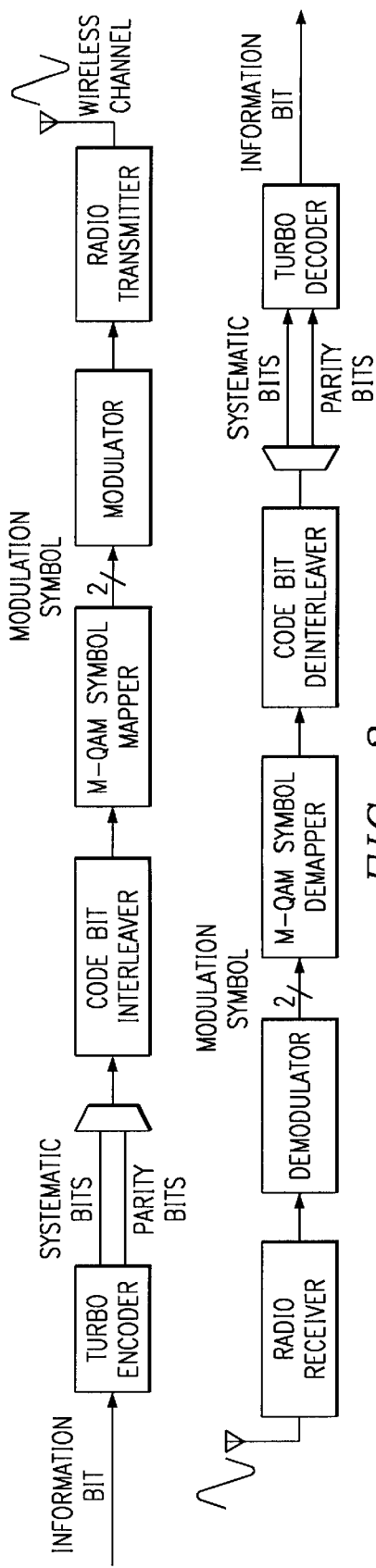
FIG. 2 shows a block diagram of a prior art communication system.
Figure 3:
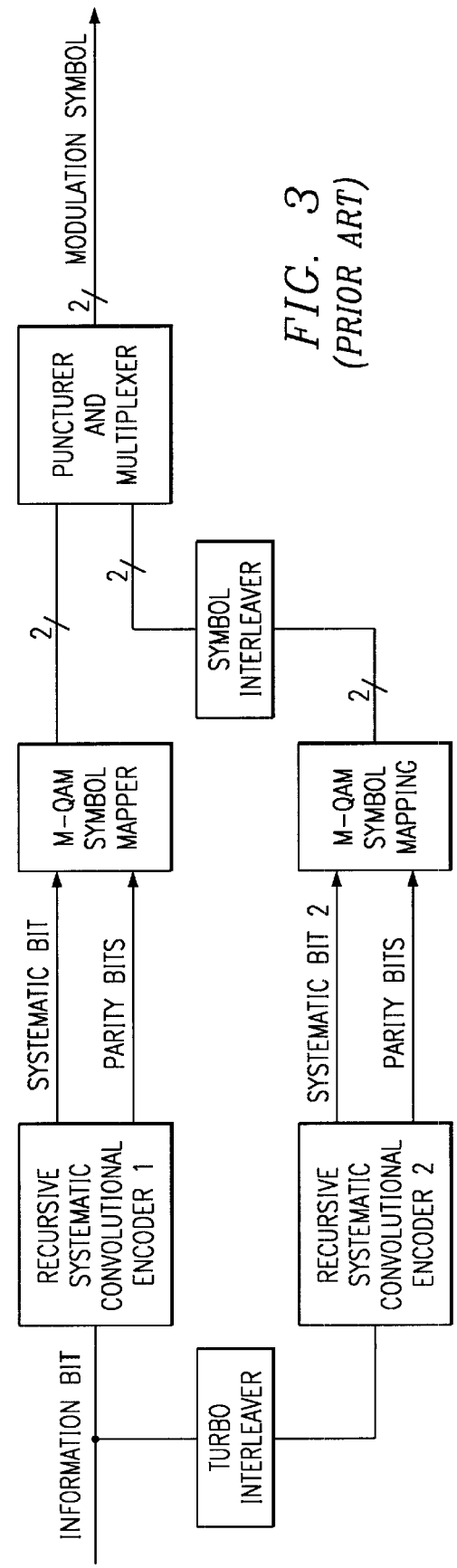
FIG. 3 shows a block diagram of a prior art turbo encoder providing a trellis modulation scheme.
Figure 4:
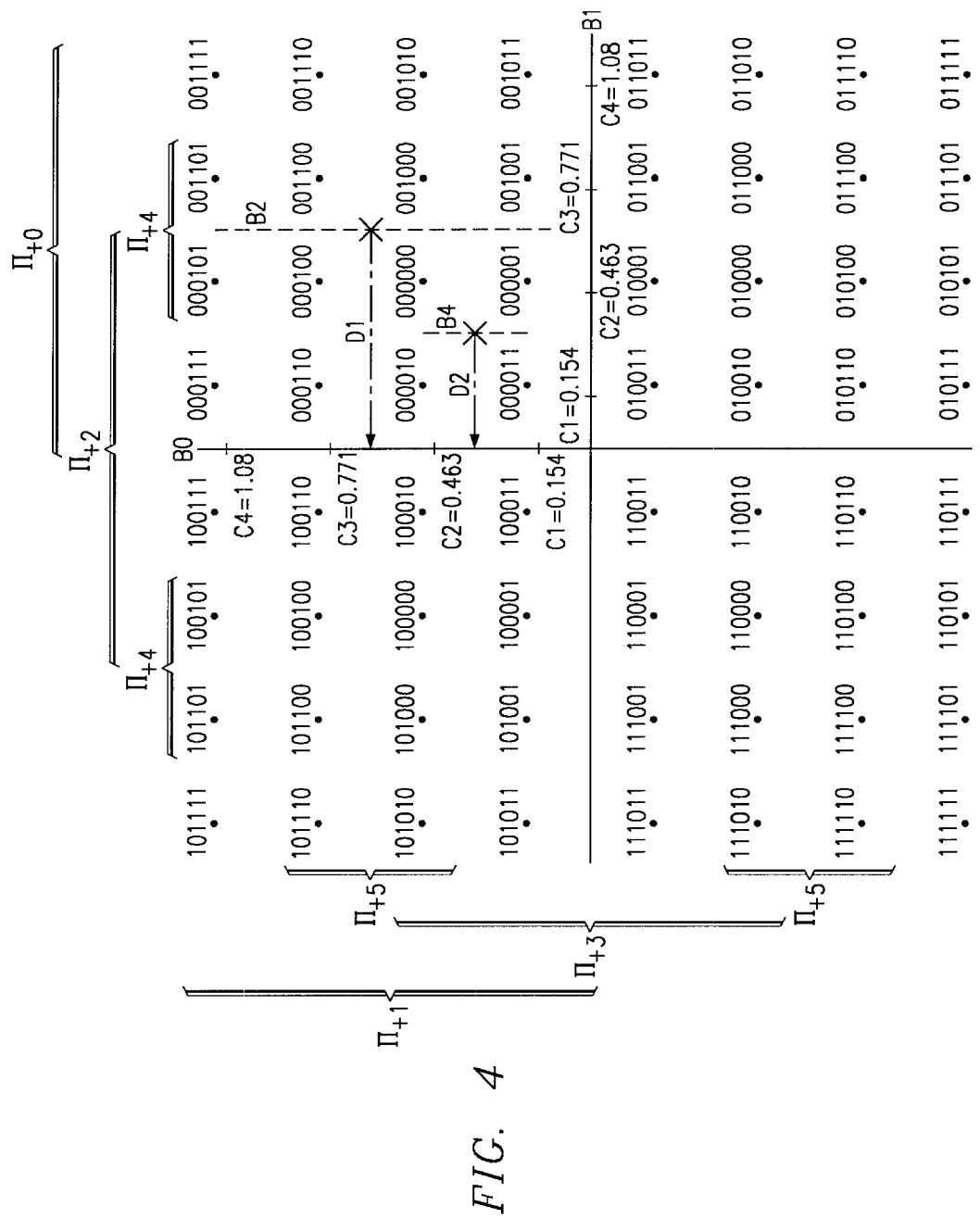
FIG. 4 shows a diagram of a QAM constellation used in one example of the present invention.

FIG. 4 illustrates an example of a specific Gray-coded 64-QAM constellation, and shows how code bits are mapped into modulation bits. The principle of mapping important information bits to well protected areas of the modulation symbol applies to other high order modulation schemes as well, 64-QAM is merely used as an example of such a high order modulation scheme. Likewise, although the example presented below uses turbo codes, the principle applies to other channel coding schemes as well.

Each point of the 64-QAM constellation is represented by two real numbers $(c_{Ii}, c_{Qi})$ i=1, . . . ,64 and corresponds to $b_0 b_1 \ldots b_5$. The first two modulation bits $b_0 b_1$ determine one of four quadrants in the constellation. The protection level against channel impairment is related to the distance between the center of each quadrant and the decision boundary B0 or B1, with that distance being equal to $D_1$=0.617, as illustrated in FIG. 4. The second pair of bits $b_2 b_3$ separate the subsets of signal points in a certain quadrant. The protection level is similarly given by the distance between the center of each subset and the decision boundary B2 or B3, such that the distance is equal to $D_2=0.308$. The protection level of the last pair of bits $b_4b_5$ is similarly given by $D_3=0.154$. The first two bits are the most well-protected, while protection decreases for each subsequent bit pair.

Some of channel encoder output bits are more important than others. For example, since the systematic bit is used for both constituent decoders in the receiver, the systematic bits should be better protected than parity bits. The systematic bit output of turbo encoder is identical with the information bit. Thus, the invention proposes to map the systematic bits to well-protected bits while mapping the parity bits to the least-protected bits whenever possible. Note that other encoding schemes may require alternate algorithms to determine bit importance.

Figure 5:
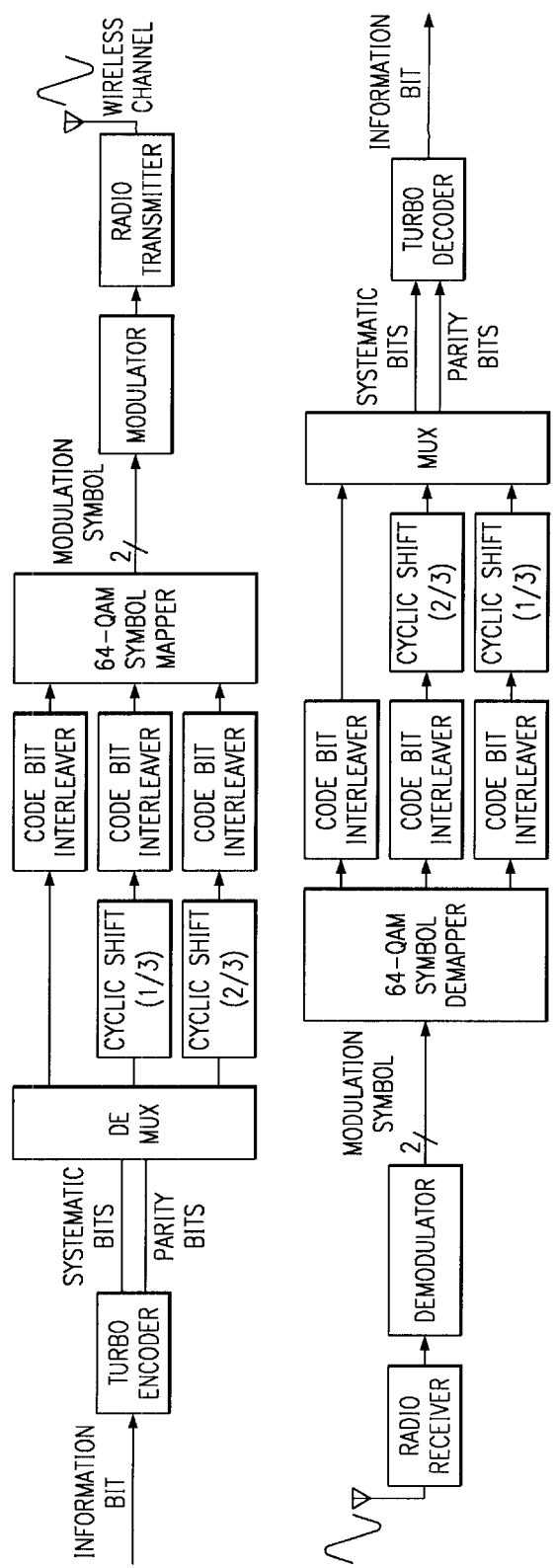
FIG. 5 shows a block diagram of a communication system in accordance with the invention.

FIG. 5 is a block diagram of the invention in the case of 64-QAM modulation with three code bit interleavers. The number of code bit interleavers is equal to the number of protection classification sets. The number of the classification sets is no larger than log2(M) in the case of M-QAM. The first code bit interleaver (INT1) output is mapped to the most well-protected pair of bits $b_0b_1$, the second INT2 to $b_2b_3$, and the third INT3 to $b_4b_5$.

The demultiplexer (DEMUX) distributes the systematic bits and the parity bits according to the number of code bit interleavers and the code rate. For instance, Table 1 shows an example of the distribution ratio for 64-QAM with three code bit interleavers. For code ¼, the first interleaver (INT 1) takes three systematic bits and any one parity bit, the second interleaver takes four other parity bits, and the third interleaver takes the remaining four parity bits, repetitively. Table 2 shows the distribution pattern for 64-QAM with two code bit interleavers, while Table 3 shows the pattern for 16-QAM.

Before being interleaved, each DEMUX output arm goes through a cyclic shift. The cyclic shift guarantees that the systematic bits and parity bits corresponding to the same information bits are well separated in time. A completely independent and unique shifting system would be optimal for system performance, but such a scheme is not practical. Therefore, independent, or at least a pseudo-random, cyclic shift patterns are introduced in each interleaver path. This permits the same circuits and software to be used for each of the demultiplexed interleaver paths. The cyclic shift of k/m is given by $$Y(n) = X(\mod(n + kN/m, N)) \quad k = 1, 2, \ldots, m-1.$$

Mod(n,N) is the modulo function, N is the size of the code bit interleaver, m is the number of code bit interleavers. The output of the cyclic shift and interleavers is used for modulation symbol mapping.

In general, the number of interleaver paths (n) is equal to the number of protection levels offered by the modulation symbol mapping. For example, 16 QAM and 8 PSK offer two levels of protection, therefore, there are two interleaver paths. 32 and 64 QAM offer three levels of protection, so there are three interleaver paths. 128 and 256 QAM offer four levels of protection, so there four interleaver paths are optimal. Since BPSK offers only one level, there need be only one interleaver path, as is conventional. With QAM, the level of protection is determined as follows:

$2^{2n}$ QAM offer n levels of protection.

The above operations are performed in the reverse order in the receiver.

What is claimed is:

1. In a wireless communications system, a method to prioritize protection in the symbol mapping of selected information, the method comprising:
   supplying information bits and overhead bits;,
   interleaving the information bits and overhead bits to supply a plurality of interleaved data blocks;
   selectively mapping the plurality of interleaved data blocks into a modulation symbol.

2. The method of claim 1 further comprising:
   accepting information bits;
   encoding the information bits; and
   wherein supplying information bits and overhead bits includes supplying the information bits and overhead bits in response to encoding the information bits.

3. The method of claim 2 wherein interleaving the information bits and overhead bits to supply a plurality of interleaved data blocks includes interleaving the information bits and overhead bits to supply at least a first and second interleaved data block; and
   wherein selectively mapping the plurality of interleaved data blocks into a modulation symbol includes mapping the first interleaved data block into a first class of modulation bits and mapping the second interleaved data block into a second class of modulation bits, more prone to error than the first class of modulation bits.

4. The method of claim 3 further comprising:
   following the supplying of information bits and overhead bits, identifying the information bits; and
   wherein interleaving the information bits and overhead bits to supply at least a first and second interleaved data block includes demultiplexing the information and overhead bits to supply information bits in the first interleaved information block and overhead bits in the second interleaved data block.

5. The method of claim 4 further comprising:
   independently shifting the sequence of bits in a cyclic pattern, in each of the plurality of interleaved data blocks.

6. The method of claim 5 wherein demultiplexing the information and overhead bits to supply information bits in the first interleaved information block and overhead bits in the second interleaved data block includes demultiplexing the information and overhead bits into n interleaved data blocks; and
   wherein selectively mapping the plurality of interleaved data blocks into a modulation symbol includes mapping the n interleaved data blocks into n classes of modulation bits, where each class of modulation bits has a different level of sensitivity to error.

7. The method of claim 6 wherein accepting information bits includes accepting two information bits;
   wherein supplying information bits and overhead bits, following encoding, includes supplying two information bits and four overhead bits;
   wherein interleaving the information bits and overhead bits to supply a plurality of interleaved data blocks includes interleaving to provide a first interleaved data block of information bits, a second interleaved data block of overhead bits, and a third interleaved block of overhead bits;
   wherein independently shifting the sequence of bits in each of the plurality of interleaved data blocks includes shifting the bits in the first interleaved data block a first number of bits, shifting the bits in the second interleaved data block a second number of bits, different than the first number, and shifting the bits in the third interleaved data block a third number of bits, different than the first and second number; and wherein selectively mapping the plurality of interleaved data blocks into a modulation symbol includes mapping the interleaved data blocks into a 64 quadrature amplitude modulation symbol, wherein the first interleaved data block is mapped by the modulation bits which determine the constellation quadrant, wherein the second interleaved data block is mapped by the modulation bits which determine the quadrant section, and wherein the third interleaved data block is mapped by the modulation bits which determine the exact modulation symbol value.

8. A wireless transmitter, comprising:

an encoder having an output providing information bits and overhead bits;

first and second code bit interleavers;

a demultiplexer coupled to the output of the encoder for distributing the information and overhead bits provided at the output of the encoder to the first and second code bit interleavers as a plurality of interleaved data blocks; and a mapper coupled to the first and second code bit interleavers for mapping the plurality of interleaved data blocks into a modulation symbol.

9. A wireless transmitter as defined in claim 8, wherein the first and second code bit interleavers interleave the information bits and overhead bits to supply at least first and second data blocks; and wherein the mapper selectively maps the first interleaved data block into a first class of modulation bits and maps the second interleaved data block into a second class of modulation bits, more prone to error than the first class of modulation bits.

10. A wireless transmitter as defined in claim 8, further comprising:

first and second cyclic shifters coupled between the demultiplexer and the first and second code bit interleavers.

* * * * *